US006885566B2

United States Patent
Chen

(10) Patent No.: US 6,885,566 B2
(45) Date of Patent: Apr. 26, 2005

(54) ASSEMBLY FOR SUPPORTING EXPANSION CARD MOTHERBOARD

(75) Inventor: Kuei-Hua Chen, Taipei (TW)

(73) Assignee: Inventec Corp., Taipei (TW)

( * ) Notice: Subject to any disclaimer, the term of this patent is extended or adjusted under 35 U.S.C. 154(b) by 0 days.

(21) Appl. No.: 10/600,440

(22) Filed: Jun. 23, 2003

(65) Prior Publication Data

US 2004/0257785 A1 Dec. 23, 2004

(51) Int. Cl.[7] .......................... H05K 7/14; H05K 7/16
(52) U.S. Cl. .................. 361/802; 361/756; 361/741
(58) Field of Search ................. 361/732, 741, 361/740, 747, 754–756, 759, 801, 796, 798, 802, 807; 439/157, 160; 211/41.17

(56) References Cited

U.S. PATENT DOCUMENTS 5,259,783 A * 11/1993 Hileman et al. ............ 439/372
6,556,451 B1 * 4/2003 Feightner et al. .......... 361/756
6,693,800 B1 * 2/2004 Lin et al. .................. 361/759

* cited by examiner

Primary Examiner—Kamand Cuneo
Assistant Examiner—Dameon E. Levi
(74) Attorney, Agent, or Firm—Bacon & Thomas, PLLC

(57) ABSTRACT

A support assembly for holding up an expansion card on a motherboard of an electronic device includes a pedestal having a pivotal carrier pivotably coupled to an upper part thereof and comprising a horizontal trough adjacent a top. In response to insertion of the expansion card into an expansion slot of the motherboard by means of a dummy adapter, an edge of the expansion card engages a slanted surface of the carrier to turn the carrier and capture the edge of the expansion card in the trough.

5 Claims, 3 Drawing Sheets

ASSEMBLY FOR SUPPORTING EXPANSION CARD MOTHERBOARD

FIELD OF THE INVENTION

The present invention relates to support assemblies and more particularly to a support assembly for reliably holding up an expansion card on a motherboard of a server.

BACKGROUND OF THE INVENTION

In response to all kinds of new information products being developed, especially when personal computers being widely used, more and more users become more critical with respect to the convenience in using them. For increasing data transfer speed of computer peripherals, a PCI (Peripheral Component Interconnect) local bus being developed by Intel Corp. PCI has become the widely used bus in its respective market. This means that other low speed buses (e.g., ISA (Industry Standard Architecture), etc.) will gradually be replaced by PCI in the computer market.

Currently, installing expansion slots on a motherboard of a computer for inserting PCI-compliant expansion cards is a dominant trend in the market. For a typical ATX type motherboard, five (5) or more PCI expansion slots are provided thereon. Conventionally, the higher the number of expansion slots on the motherboard the more powerful the expansion capability of the computer. In this regard, all major computer and/or electronics companies continuously make efforts to develop and/or improve the structures of expansion slots and cards in order to meet the needs of consumers. However, arrangements for fastening the expansion card are rarely improved.

For the current industrial IU (IU=44.45 mm) servers, in addition to a motherboard installed therein, only few associated electronic devices can be provided in the IU server due to the limitation of server height. However, in order to improve the performance of the server, an additional expansion card (e.g., the above PCI expansion card) is mounted on the motherboard for increasing the processing capability of the server.

Due to the limited server height, a typical process of installing an expansion card on a motherboard is by coupling the expansion card to a dummy adapter so as to change an orientation of inserting the expansion card to an expansion slot on the mother board of the server. Though the prior process can avoid the limitation of server height, it still suffered from several disadvantages. For example, the structures for supporting and fastening the expansion card on the motherboard are weak and unreliable. This means that the expansion card is susceptible to the vibration, which would easily cause the coupling between the expansion card and the dummy adapter loosened, resulting in a breakdown of the computer. To the worse, golden fingers of the expansion card can be damaged. Thus, it is understood that if no effective support and fastening means is provided, more inconvenience and trouble in replacing a malfunctioned expansion card or installing a new expansion card in the expansion slot would keep on troubling users. Consequently, this may cause users to complaint more about the fastening in installing an expansion card and discourage users to install new expansion cards. As a result, it will hardly hurt the market of supplying the expansion card.

In another point of view, for keeping up with the needs of the vast computer assembly market, computer manufacturing companies not only have to maintain product quality but also have to increase the assembly speed. Therefore, with respect to the requirement of increasing the assembly speed in the assembly line, particularly to the fastening of expansion cards has become an important factor in increasing computer assembly speed.

SUMMARY OF THE INVENTION

A primary object of the present invention is to provide a support assembly for holding up an expansion card on a motherboard of an electronic device (e.g., server). The support assembly comprises a pedestal, and a pivotal carrier pivotably coupled to an upper part of the pedestal, the pivotal carrier comprising a horizontal trough adjacent a top. In response to an insertion of the expansion card into an expansion slot of the motherboard by means of a dummy adapter, an edge of the expansion card is urged on a bottom distal end of a trough in the dummy adapter, and the edge of the expansion card is adapted to cling into the trough for fastening by turning the pivotal carrier. As a result, the purpose of reliably supporting the expansion card is achieved. The support assembly of the invention can quickly install and fasten the expansion card on the motherboard without requiring screws. Further, the support assembly has advantages of being compact, simple, convenient assembly or disassembly, and ergonomic. By utilizing this, the above drawbacks of the prior art can be overcome. These drawbacks are that server height is limited, both support and fastening of the expansion card on the motherboard are weak and unreliable, the expansion card is susceptible to the vibration in the expansion slot, a coupling between the expansion card and the dummy adapter tends to loosen, resulting in a breakdown of computer, and golden fingers of the expansion card tend to damage.

The above and other objects, features and advantages of the present invention will become apparent from the following detailed description taken with the accompanying drawings.

DETAILED DESCRIPTION OF THE PREFERRED EMBODIMENTS

Figure 1:
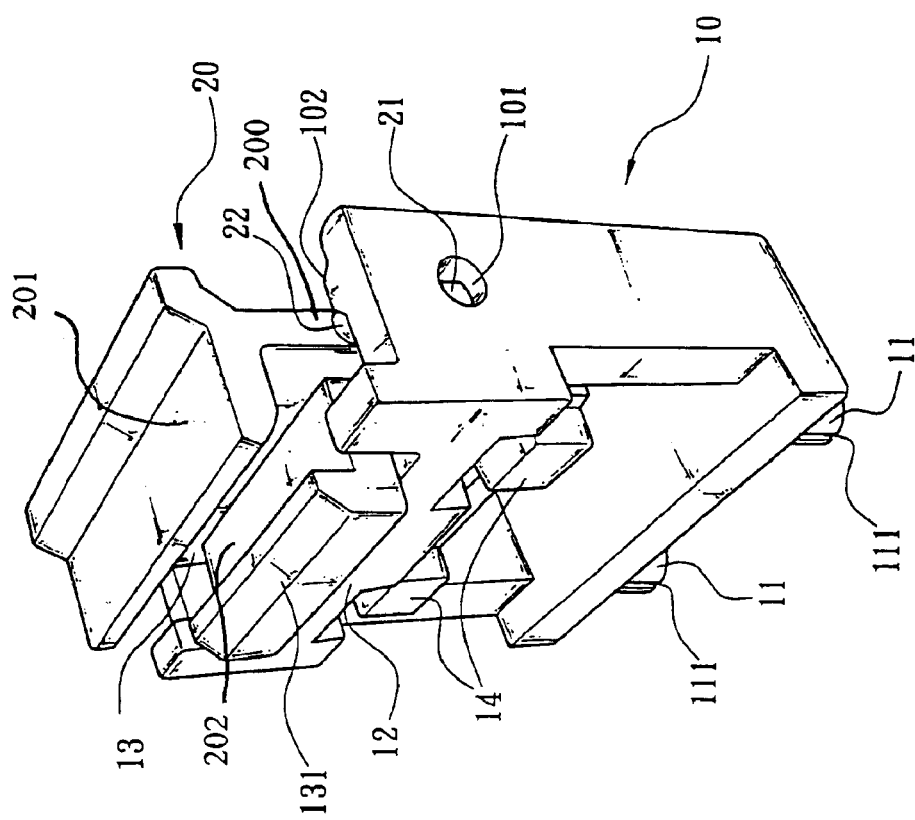
FIG. 1 is a perspective view of a preferred embodiment of support assembly according to the invention.
Figure 2:
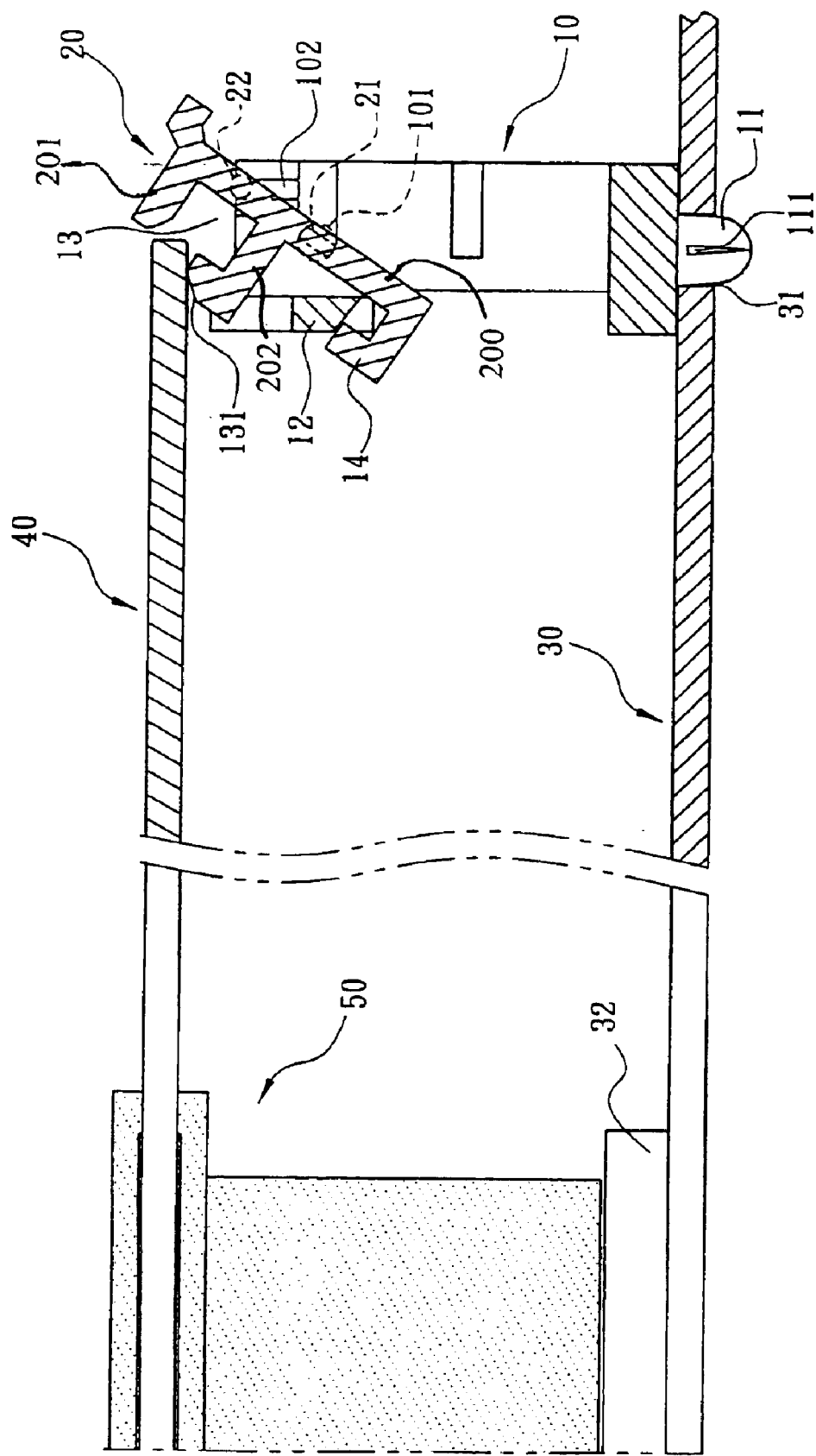
FIG. 2 is a sectional view depicting the support assembly interconnected an expansion card and a motherboard during mounting.
Figure 3:
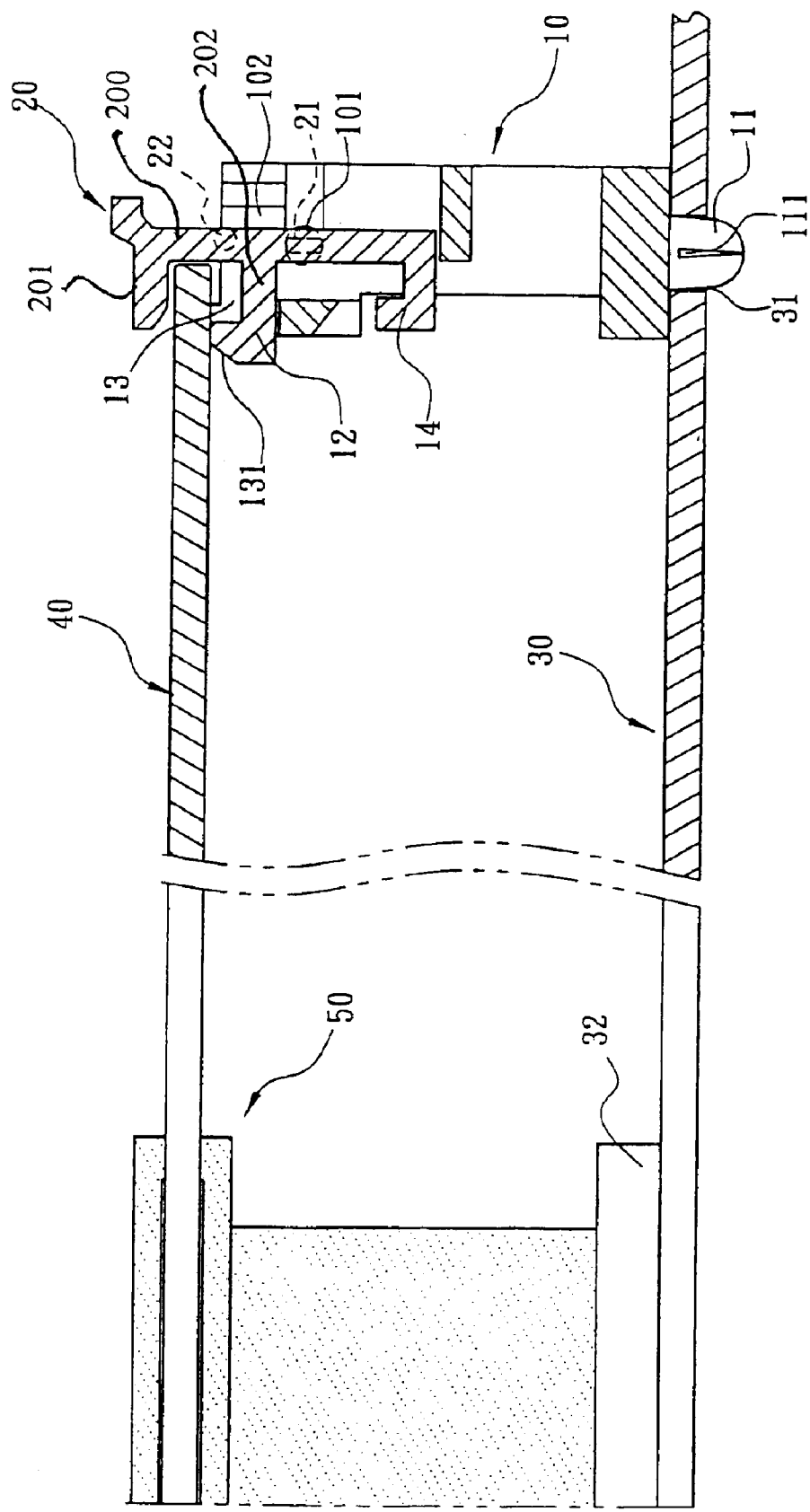
FIG. 3 is similar to FIG. 2, the support assembly being mounted.

Referring to FIGS. 1, 2, and 3, there is shown a support assembly for holding up an expansion card on a mother board 30 of an electronic device (e.g., server) in accordance with the invention. As shown in FIG. 1, the support assembly comprises a pedestal 10 and a pivotal carrier 20. The pedestal 10 is a substantially cubic, hollow frame in the embodiment, while it is appreciated by those skilled in the art that the pedestal 10 may have any of other shapes without departing from the scope and spirit of the invention. A plurality of pegs 11 are formed on an underside of the pedestal 10. The pegs 11 are adapted to be inserted into a plurality of holes 31 on the motherboard 30 so as to secure the support assembly to the mother board 30 (see FIGS. 2 and 3). A predetermined distance is maintained between any two adjacent pegs 11. Also, a longitudinal gap 111 is formed in the peg 11 so that the peg 11 can have a good flexibility for facilitating its insertion for fastening or removal. The pedestal 10 further comprise a top positioning section 12 having a length sufficient to permit the pivotal carrier 20 and two side pivots 21 of the pivotal carrier 20 each having one end respectively fitted in two side holes 101 of the pedestal 10 to pivot about the holes 101.

In the invention, the pivotal carrier 20 includes a main plate 200, a top plate 201 extending transversely from the main plate, and a middle plate 202 also extending transversely from the main plate 200, a horizontal trough 13 being formed between the top plate 201 and the middle plate 202 of the pivotal carrier 20 (see FIGS. 1, 2, and 3). A slanted surface 131 is formed on an upwardly extending portion of the middle plate 202. The slanted surface 131 is disposed above the positioning section 12 of the pedestal 10. The provision of the slanted surface 131 facilitates an edge of an expansion card (e.g., PCI-compliant expansion card) 40 to urge downward thereon. At the same time, the edge of the expansion card 40 is adapted to pass the slanted surface 131 to enter and be positioned in the trough 13 by turning the pivotal carrier 20.

In the invention at least one positioning member 14 is formed on a bottom of the pivotal carrier 20 facing the positioning section 12. The positioning member 14 is implemented as a projection and is disposed under the positioning section 12 of the pedestal 10. The provision of the positioning member 14 can limit a pivotal angle of the pivotal carrier 20 as the positioning member 14 is urged against the positioning section 12 by turning the pivotal carrier 20 (see FIG. 2).

It is obvious from the above configuration that a process of installing the expansion card (e.g., PCI-compliant expansion card) 40 comprises inserting the pegs 11 of the pedestal 10 into the plurality of holes 31 on the motherboard 30 (see FIGS. 2 and 3), vertically inserting one end of a dummy adapter 50 together with the expansion card 40 mounted thereon through its golden fingers or contacts (not shown) into an expansion slot 32 of the motherboard 30 (see FIG. 2) with the edge of the expansion card 40 urged into the trough 13 in the pivotal carrier 20, the trough 30 thereby capturing the edge of the expansion card 40 so that the edge of the expansion card 40 is securely positioned in the trough 13 (see FIG. 3). As a result, the expansion card 40 is reliably fastened. This can eliminate prior problems of vibration and loosening due to no support and fastening for the expansion card 40.

Referring to FIG. 1 again, in the invention a protuberance 22 is formed adjacent either side pivot 21 of the pivotal carrier 20. Also, a protrusion 102 is formed adjacent either side hole 101 of the pedestal 10. The provision of both the protuberances 22 and the protrusions 102 can prevent the pivotal carrier 20 from further turning once the pivotal carrier 20 has turned a predetermined angle, i.e., the pivotal carrier 20 is fastened.

In view of the above, the support assembly of the invention can quickly install and fasten the expansion card 40 on the motherboard 30 without requiring screws. Most importantly, the support assembly has the advantages of being compact, simple, convenient assembly or disassembly, and ergonomic.

While the invention has been described by means of specific embodiments, numerous modifications and variations could be made thereto by those skilled in the art without departing from the scope and spirit of the invention set forth in the claims.

What is claimed is:

1. A support assembly for holding up an expansion card on a motherboard, comprising:

a pedestal comprising a plurality of pegs on an underside, the pegs being inserted into a plurality of holes on the motherboard for securing the support assembly to the motherboard, and a top positioning section; and a pivotal carrier comprising two side pivots extending from a main plate and fitted in two side holes of the pedestal for enabling the pivotal carrier to pivot about the holes, a top plate extending transversely from the main plate, a middle plate extending transversely from the main plate, and a horizontal trough between top plate and the middle plate, and at least one positioning member on a bottom of the pivotal carrier facing the positioning section and disposed under the positioning section so that the positioning member is adapted to limit a pivotal angle of the pivotal carrier as the positioning member is urged against the positioning section by turning the pivotal carrier, said middle plate includes an upwardly extending portion having a slanted surface, wherein in response to an insertion of the expansion card into an expansion slot of the motherboard through a dummy adapter, an edge of the expansion card engages said slanted surface and causes said pivotal carrier to pivot about the holes, thereby urging said edge of the expansion card into the trough.

2. The support assembly of claim 1, wherein the pedestal is a substantially cubic, hollow frame.

3. The support assembly of claim 1, wherein the peg is flexible and comprises a longitudinal gap so as to facilitate the insertion for fastening or removal.

4. The support assembly of claim 1, wherein the positioning member is a projection.

5. The support assembly of claim 1, further comprising a protuberance adjacent either side pivot of the pivotal carrier, and a protrusion adjacent either side hole of the pedestal so that both the protuberances and the protrusions are adapted to prevent the pivotal carrier from further turning in a fastened state once the pivotal carrier has turned to urge said expansion card into the trough.

* * * * *